United States Patent
Takayama et al.

(10) Patent No.: US 9,269,916 B2
(45) Date of Patent: Feb. 23, 2016

(54) ORGANIC THIN-FILM SOLAR CELL MODULE AND SUB-MODULE

(75) Inventors: Satoshi Takayama, Kawasaki (JP); Hideyuki Nakao, Tokyo (JP); Akihiko Ono, Tokyo (JP); Michihiko Inaba, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/419,473

(22) Filed: Mar. 14, 2012

(65) Prior Publication Data

US 2012/0234372 A1  Sep. 20, 2012

(30) Foreign Application Priority Data

Mar. 15, 2011  (JP) .................................. 2011-057039

(51) Int. Cl.
  *H01L 31/054*  (2014.01)
  *H01L 51/44*  (2006.01)
  *H01L 27/30*  (2006.01)

(52) U.S. Cl.
  CPC ............ *H01L 51/447* (2013.01); *H01L 27/301* (2013.01); *Y02E 10/52* (2013.01); *Y02E 10/549* (2013.01)

(58) Field of Classification Search
  CPC .............. H01L 31/052; H01L 31/0522; H01L 31/0525
  USPC .......................................... 136/246, 259, 263
  See application file for complete search history.

(56) References Cited

U.S. PATENT DOCUMENTS

| | | | | |
|---|---|---|---|---|
| 5,538,563 A | * | 7/1996 | Finkl .............................. | 136/246 |
| 2005/0227406 A1 | * | 10/2005 | Shtein et al. .................... | 438/99 |
| 2007/0295381 A1 | * | 12/2007 | Fujii et al. ...................... | 136/244 |
| 2009/0151769 A1 | * | 6/2009 | Corbin ........................... | 136/246 |
| 2009/0229667 A1 | * | 9/2009 | Shrotriya et al. ............. | 136/263 |
| 2010/0108133 A1 | | 5/2010 | Bhagavatula et al. | |

FOREIGN PATENT DOCUMENTS

| | | |
|---|---|---|
| JP | 7-066439 A | 3/1995 |
| JP | 11-243225 A | 9/1999 |

(Continued)

OTHER PUBLICATIONS

Hosoya, et al.; "Efficiency Enhancement by Sloped Cell Architecture in Organic Photovoltaics"; Renewable Enery 2010 Proceedings, Jun. 27-Jul. 2, 2010; O-Pv-9-1; 4 pages.

(Continued)

*Primary Examiner* — James Lin
*Assistant Examiner* — Dujuan Horton
(74) *Attorney, Agent, or Firm* — Ohlandt, Greeley, Ruggiero & Perle, L.L.P.

(57) ABSTRACT

An organic thin-film solar cell module according to one embodiment includes solar cell panels and reflective surfaces. Each panel includes a substrate, a 1st electrode, a 2nd electrode and a photoelectric conversion layer. When supposing a 1st plane including the reflective surface, a 1st intersection line as a line of intersection of the 1st plane and the 2nd main surface of the substrate, and a 2nd plane including the 1st intersection line and forming an angle of 45° with the 2nd main surface of the substrate and an angle smaller than 45° with the 1st plane, an edge of the photoelectric conversion layer is in contact with the 2nd plane or the 2nd plane intersects the photoelectric conversion layer.

10 Claims, 8 Drawing Sheets

(56) References Cited

FOREIGN PATENT DOCUMENTS

| JP | 2004-273223 A | 9/2004 |
| JP | 2008-141143 A | 6/2008 |
| WO | 2009/105268 A2 | 8/2009 |
| WO | 2010/062713 A2 | 6/2010 |

OTHER PUBLICATIONS

Japanese Office Action (with English translation) dated Mar. 26, 2013 from corresponding JP Application No. 2011-057039, 4 pp.
First Office Action from corresponding Chinese Patent Application No. 201210066992.9 dated Jun. 5, 2014; 15 pages.

* cited by examiner

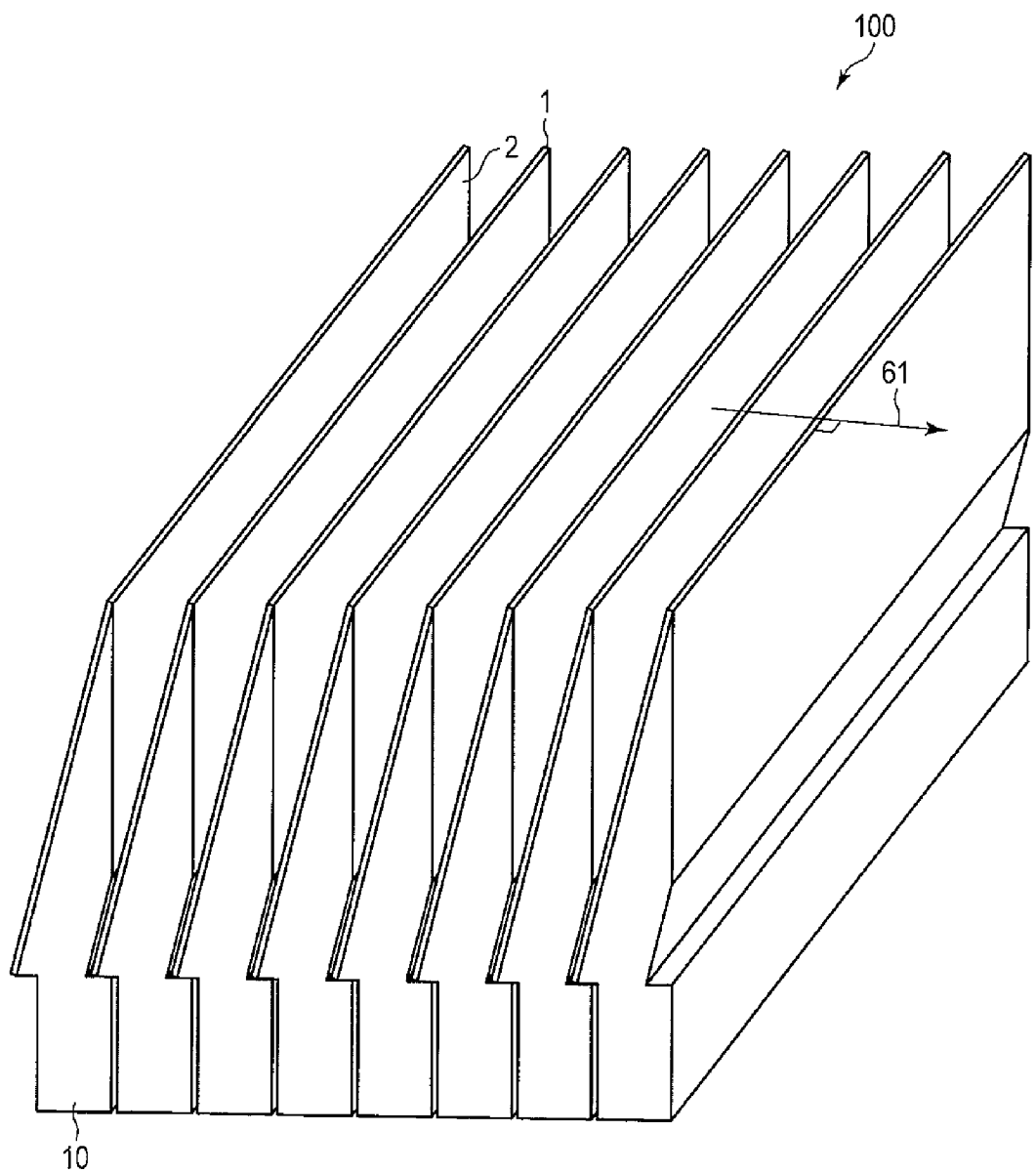
F I G. 1

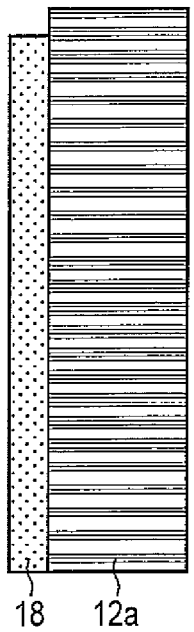 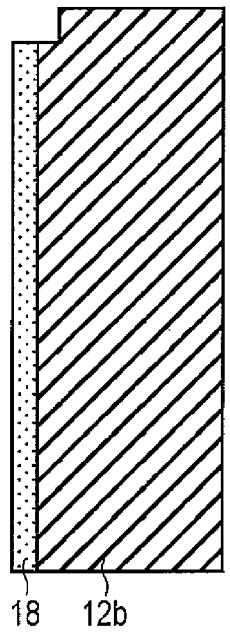 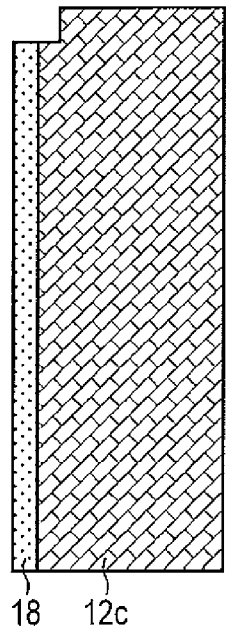 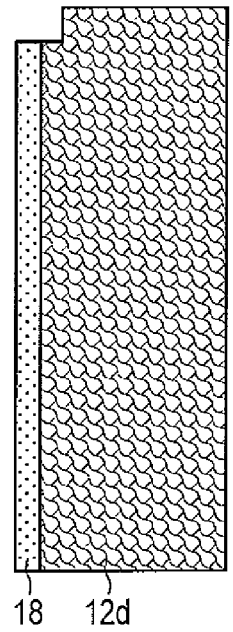
18　12a　　　18　12b　　　18　12c　　　18　12d
F I G. 6A　　F I G. 6B　　F I G. 6C　　F I G. 6D
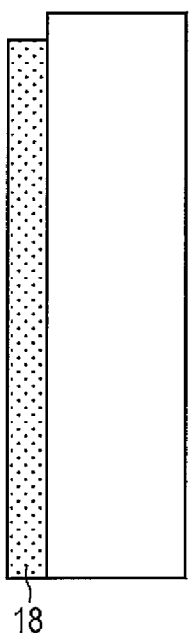
18
F I G. 6E

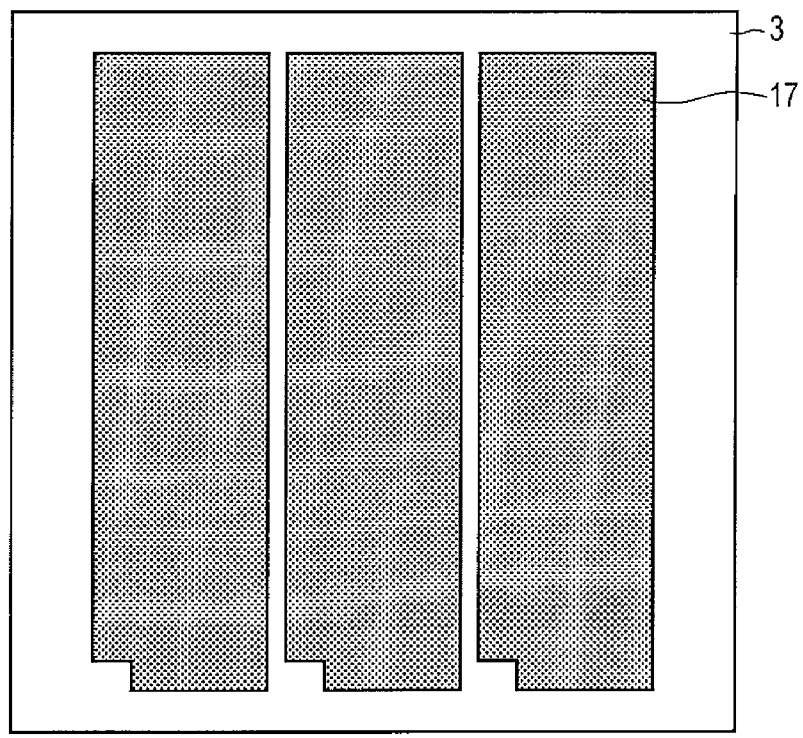
F I G. 10
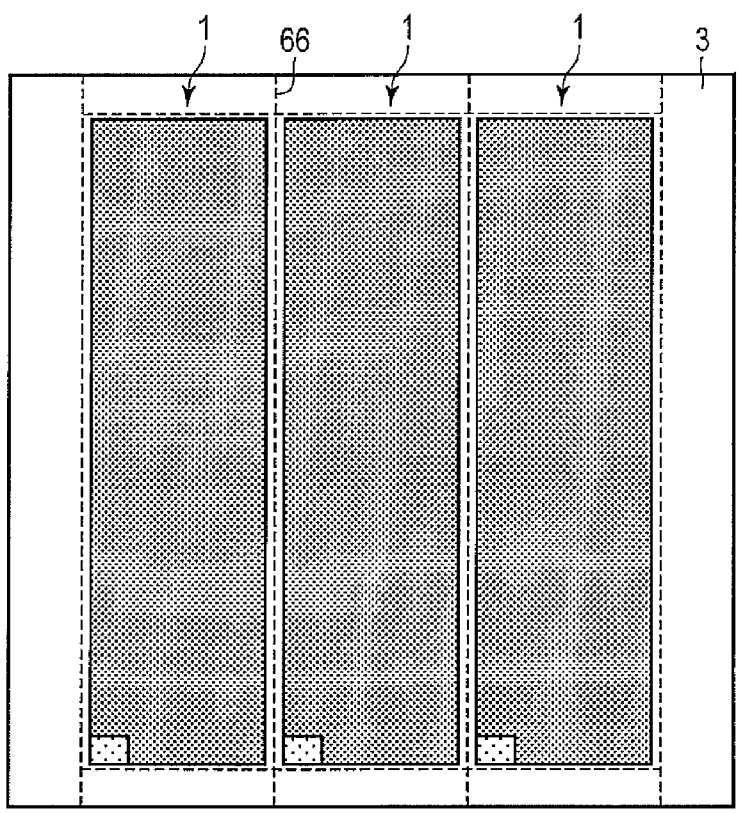
F I G. 11

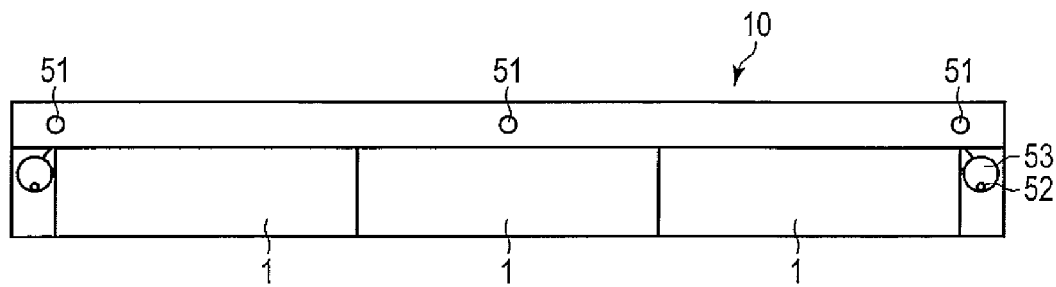
F I G. 12A
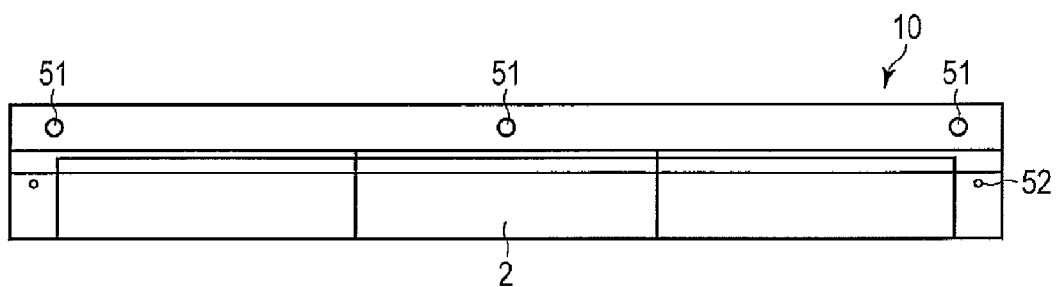
F I G. 12B
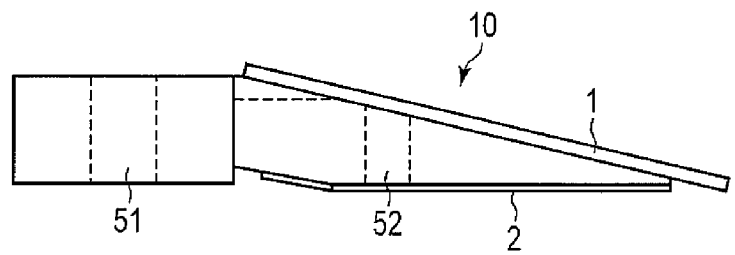
F I G. 12C
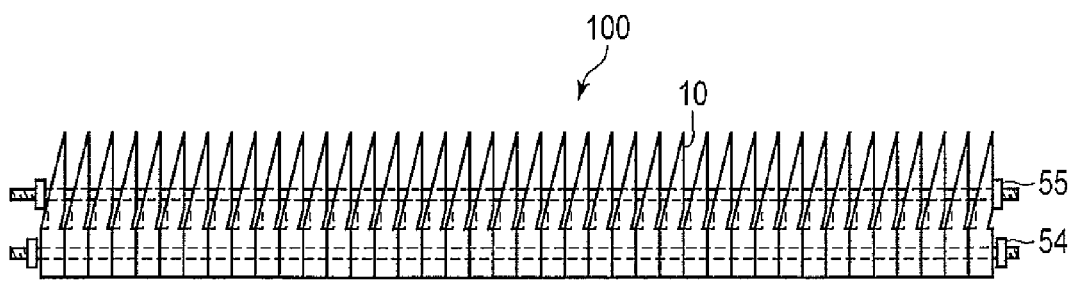
F I G. 13

US 9,269,916 B2

ORGANIC THIN-FILM SOLAR CELL MODULE AND SUB-MODULE

CROSS-REFERENCE TO RELATED APPLICATIONS

This application is based upon and claims the benefit of priority from prior Japanese Patent Application No. 2011-057039, filed Mar. 15, 2011, the entire contents of which are incorporated herein by reference.

FIELD

Embodiments described herein relate generally to organic thin-film solar cell module and sub-module.

BACKGROUND

The organic thin-film solar cell is a solar cell comprising an organic thin-film semiconductor composed of a combination of conductive polymer, fullerene, etc. The organic thin-film solar cell can be produced by a convenient process including the coating or printing of a photoelectric conversion film, so that the production cost thereof can be lower than that of a solar cell based on an inorganic material, such as silicon, CIGS, CdTe or the like. However, the photoelectric conversion efficiency and life of the organic thin-film solar cell are inferior to those of conventional inorganic solar cells. A reason therefor would be that the properties of an organic semiconductor for use in the organic thin-film solar cell are susceptible to parameters whose control is difficult, such as the purity, molecular weight distribution, orientation, etc. of semiconductor materials. Accordingly, various innovations for enhancing the power generation efficiency of the organic thin-film solar cell are required.

BRIEF DESCRIPTION OF THE DRAWINGS

FIG. 1 is a perspective view of an organic thin-film solar cell module according to an embodiment.

FIGS. 6A, 6B, 6C, 6D and 6E are views showing examples of auxiliary electrodes according to embodiments.

FIG. 10 is a view showing the configuration of a further intermediate of organic thin-film solar cell module produced in the midstream of its manufacturing process according to an embodiment.

FIG. 11 is a view showing the configuration of still a further intermediate of organic thin-film solar cell module produced in the midstream of its manufacturing process according to an embodiment.

FIGS. 12A, 12B and 12C are views showing a sub-module according to an embodiment.

FIG. 13 is a side view of an organic thin-film solar cell module according to an embodiment.

DETAILED DESCRIPTION

Figure 2:
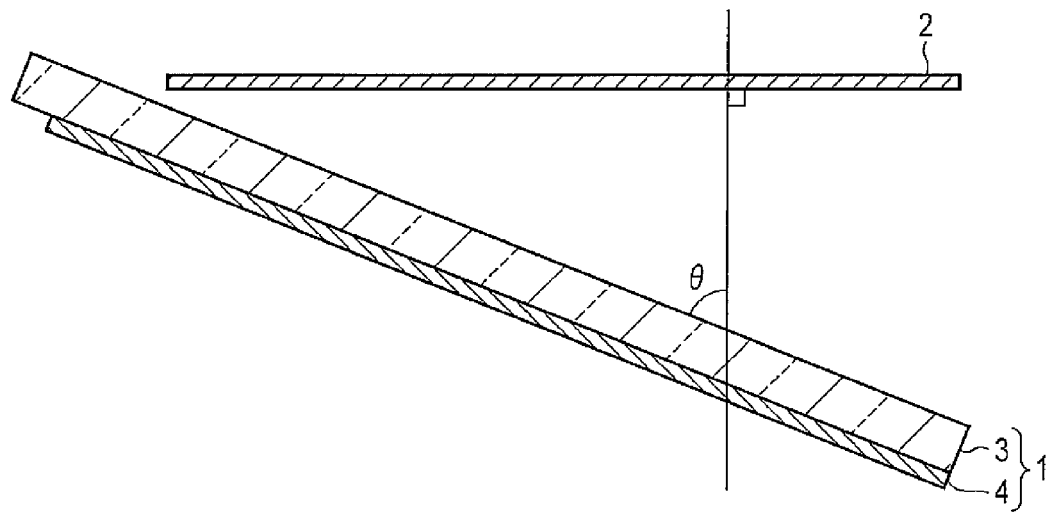
FIG. 2 is a cross-section view conceptually showing a solar cell panel and a reflective surface according to an embodiment.

In general, according to one embodiment, there is provided an organic thin-film solar cell module. The organic thin-film solar cell module comprises a plurality of solar cell panels and a plurality of reflective surfaces. Each solar cell panel comprises a substrate with first and second main surfaces, a first electrode facing the first main surface, a second electrode interposed between the substrate and the first electrode, and a photoelectric conversion layer interposed between the first and second electrodes. Reflective surfaces obliquely face portions of the second main surfaces of the solar cell panels. When supposing, in each combination of the solar cell panel and the reflective surface obliquely facing each other, a first plane including the reflective surface, a first intersection line as a line of intersection of the first plane and the second main surface of the substrate, and a second plane including the first intersection line and forming an angle of 45° with the second main surface of the substrate and an angle smaller than 45° with the first plane, an edge of the photoelectric conversion layer is in contact with the second plane or the second plane intersects the photoelectric conversion layer.

Below, the organic thin-film solar cell module according to an embodiment will be described with reference to the appended drawings.

FIG. 1 is a perspective view of an organic thin-film solar cell module 100 according to an embodiment. The organic thin-film solar cell module 100 comprises a plurality of sub-modules 10 each comprising a solar cell panel 1 and a reflective surface 2. A plurality of solar cell panels 1 are arranged so that each of the light receiving surfaces thereof tilts to the first direction 61 perpendicular to the reflective surface 2. A plurality of reflective surfaces 2 are arranged in the first direction 61 and obliquely face the light receiving surfaces of the solar cell panels 1. FIG. 1 shows an array in which the solar cell panels 1 and reflective surfaces 2 of the organic thin-film solar cell module 100 are disposed perpendicularly to a plane including the first direction and the direction perpendicular to the solar cell panels 1. This array is only an example. The solar cell panels 1 can be disposed nonparallelly to each other, and also, the reflective surfaces 2 can be disposed nonparallelly to each other.

FIG. 2 is a cross-section view conceptually showing a solar cell panel 1 and a reflective surface 2 according to an embodiment. FIG. 2 shows a coupled solar cell panel 1 and reflective surface 2 facing each other. The solar cell panel 1 tilts at an angle of θ to a plane perpendicular to the reflective surface 2. The solar cell panel 1 comprises a substrate 3 and a laminated body 4. The laminated body 4 comprises a pair of electrodes and, interposed between the pair of electrodes, a photoelectric conversion layer, etc.

Figure 3:
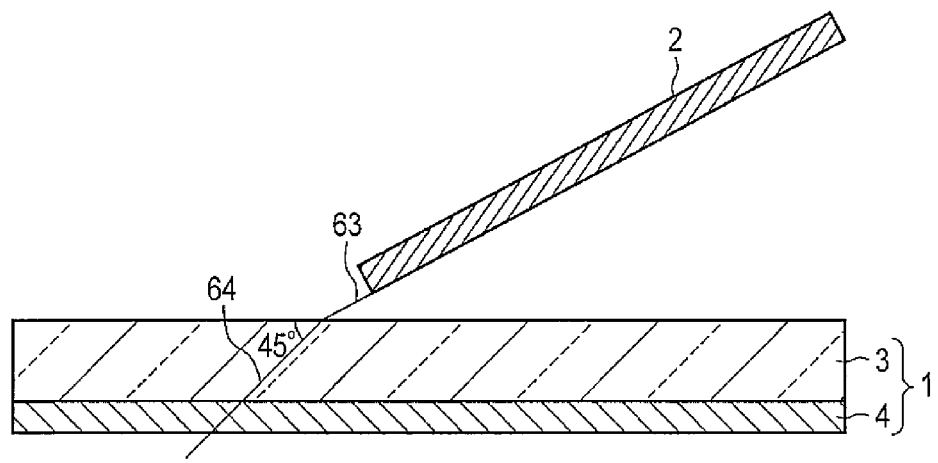
FIG. 3 is another cross-section view conceptually showing a solar cell panel and a reflective surface according to an embodiment.

FIG. 3 is another cross-section view conceptually showing a solar cell panel 1 and a reflective surface 2 according to an embodiment. A plane including the reflective surface 2 is denoted as a first plane 63, and an intersection line of the first plane 63 with a surface of the substrate 3 is denoted as a first intersection line. A plane including the first intersection line and forming an angle of 45° with the surface of the substrate 3 and an angle smaller than 45° with the first plane 63 is denoted as a second plane 64. An edge of the photoelectric conversion layer included in the laminated body 4 is in contact with the second plane 64, or the second plane 64 intersects the photoelectric conversion layer. In FIG. 3, the second plane 64 intersects the photoelectric conversion layer.

The organic thin-film solar cell module 100 according to an embodiment can be used with the light receiving surfaces of the solar cell panels 1 tilted toward a light source. For example, the organic thin-film solar cell module 100 shown in FIG. 1 can be used in a manner in which a light source is positioned in an upper portion of the sheet. In that instance, each of the solar cell panels 1 receives incident light mainly from an oblique direction. Incident light is partially reflected by the reflective surfaces 2 and fall into the solar cell panels 1. By tilting the solar cell panels 1 to the main direction of travel of incident light, the light path for the passage of light through the photoelectric conversion layer can be extended without increasing the thickness of the photoelectric conversion layer. Accordingly, the amount of generated excitons is increased with the result that the amount of electric current obtained can be increased. Further, as the thickness of the photoelectric conversion layer can be held small, any increase of film resistance can be inhibited with the result that generated carriers are efficiently transported to the electrode without being deactivated. As a consequence, the power generating efficiency of the organic thin-film solar cell module 100 can be enhanced.

Figure 4:
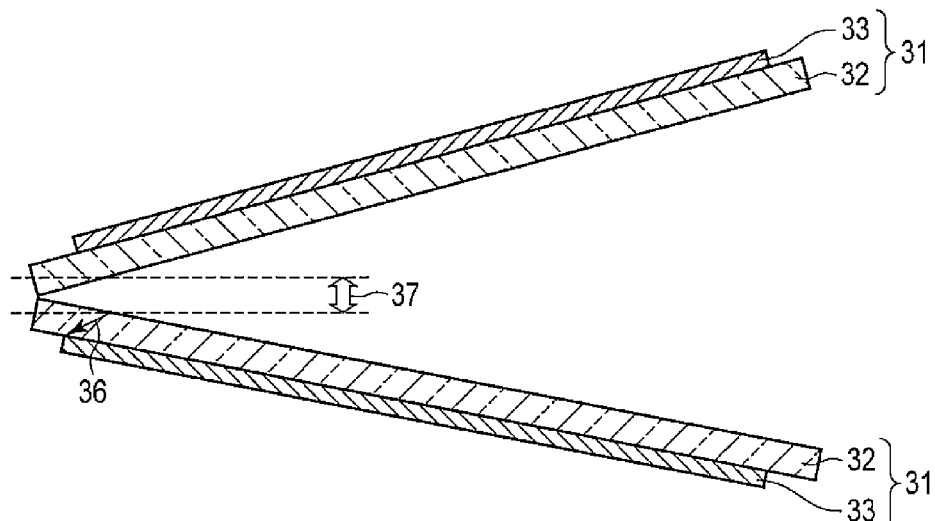
FIG. 4 is a cross-section view conceptually showing a solar cell panel according to a comparative example.

However, when the solar cell panels are tilted to the direction of incident light, there might occur some loss of incident light. FIG. 4 is a cross-section view conceptually showing a solar cell panel according to a comparative example. FIG. 4 shows a pair of solar cell panels 31 obliquely facing each other. Each of the solar cell panels 31 comprises a substrate 32 and a laminated body 33 including an electrode, a photoelectric conversion layer, etc. laminated together. When light incidence is effected in the horizontal direction from the right of the sheet, as the solar cell panels 31 are tilted to the light, the light path can be extended and the amount of electric current can be increased as mentioned hereinbefore. However, in this instance, there occurs an ineffective region of light 37. Namely, a portion of incident light passing through a region denoted by numeral 37 cannot pass through the photoelectric conversion layer of the laminated body 33 to thereby fail to contribute to power generation. When incident light strikes the substrate 32 and refracted light 36 occurs, a region in which the refracted light 36 cannot reach the laminated body 33 is the ineffective region of light 37.

In contrast, in the organic thin-film solar cell module 100 according to an embodiment, the above-mentioned ineffective region of light 37 scarcely occurs. As shown in FIGS. 2 and 3, in the organic thin-film solar cell module 100 according to an embodiment, a portion of the solar cell panel 1 is disposed in a position deeper than that of the reflective surface 2 to the light source. The first plane 63 including the reflective surface 2 is provided so as to pass through the photoelectric conversion layer of the solar cell panel 1. By virtue of this arrangement, all of light incoming in parallel to the reflection surface 2 to a space between the solar cell panel 1 and the reflective surface 2 irradiates the photoelectric conversion layer. Further, light incoming in nonparallel to the reflective surface 2 and light reflected on the surface of the substrate 3 are reflected by the reflective surface 2 to thereby irradiate the photoelectric conversion layer. In this manner, light passing through an area close to the portion of contact of the reflective surface 2 with the solar cell panel 1 can irradiate the photoelectric conversion layer, so that the ineffective region of light can be eliminated. As a consequence, any incident light can be utilized for photoelectric conversion without incurring waste, thereby attaining a high power generating efficiency.

Moreover, in the organic thin-film solar cell module 100 according to an embodiment, the photoelectric conversion layer is provided in at least any region of the solar cell panel 1 which incident light can reach. When a portion of the solar cell panel 1 is disposed in a position deeper than that of the reflective surface 2 to the light source in order to eliminate the ineffective region of light 37 as mentioned above, in the solar cell panel 1 there occurs a region which incident light can scarcely reach. This region exists in the portion of the solar cell panel 1 deeper than the reflective surface 2 when viewed from the light source. The fabrication of unneeded photoelectric conversion layer, etc. can be avoided by identifying the region of the photoelectric conversion layer which all light incoming in a space between the reflective surface 2 and the solar cell panel 1 can reach in consideration of the refraction on the substrate 3.

The region which incident light can scarcely reach, referring to FIG. 3, lies to the left of the second plane 64 on the figure. Providing that the angle θ is set within a practical range, light traveling in parallel to the reflective surface 2 and falling in the substrate 3 perpendicularly to the first intersection line, when the substrate 3 is glass, is refracted at a refraction angle of about 45° taking its refractive index into account. This incident light necessarily passes to the right of the first plane 63 on the figure, so that the refracted light passes to the right of the second plane 64 on the figure. Therefore, disposing the photoelectric conversion layer in a region which incident light cannot reach can be avoided by arranging so that an edge of the photoelectric conversion layer included in the laminated body 4 is brought into contact with the second plane 64. For the purpose of preventing the breakage of members by expansion and contraction, when an edge of the reflective surface 2 is not brought into contact with the surface of the substrate 3, a gap is provided therebetween. In the use of a non-glass material as the substrate 3, taking the refractive index of the material into account, it is considered that the refracted light passing through the substrate 3 travels to the right of the second plane 64 on the figure.

Referring to FIG. 2, the acute angle θ made by the plane perpendicular to the reflective surface 2 and the solar cell panel 1 can be set within a practical range. For example, the angle θ can be in the range of 45° to 89°. When the angle θ is 45° or greater, the light path is satisfactorily long with the result that an enhancement of the photoelectric conversion efficiency is attained. However, when the angle θ exceeds 89°, the light absorption at the passage of incident light through the substrate 3 or a transparent electrode would be extremely large, thereby inviting a drop of efficiency. Preferably, the angle θ can be set within the range of 60° to 75°.

Now, the solar cell panel 1 will be described with reference to FIG. 5.

In the organic thin-film solar cell module 100 according to an embodiment, the solar cell panel 1 comprises a substrate 3, a first electrode facing the substrate 3, a second electrode interposed between the substrate 3 and the first electrode and, a bulk heterojunction photoelectric conversion layer 19 containing a p-type organic semiconductor and an n-type organic semiconductor, interposed between the first electrode and the second electrode.

Figure 5:
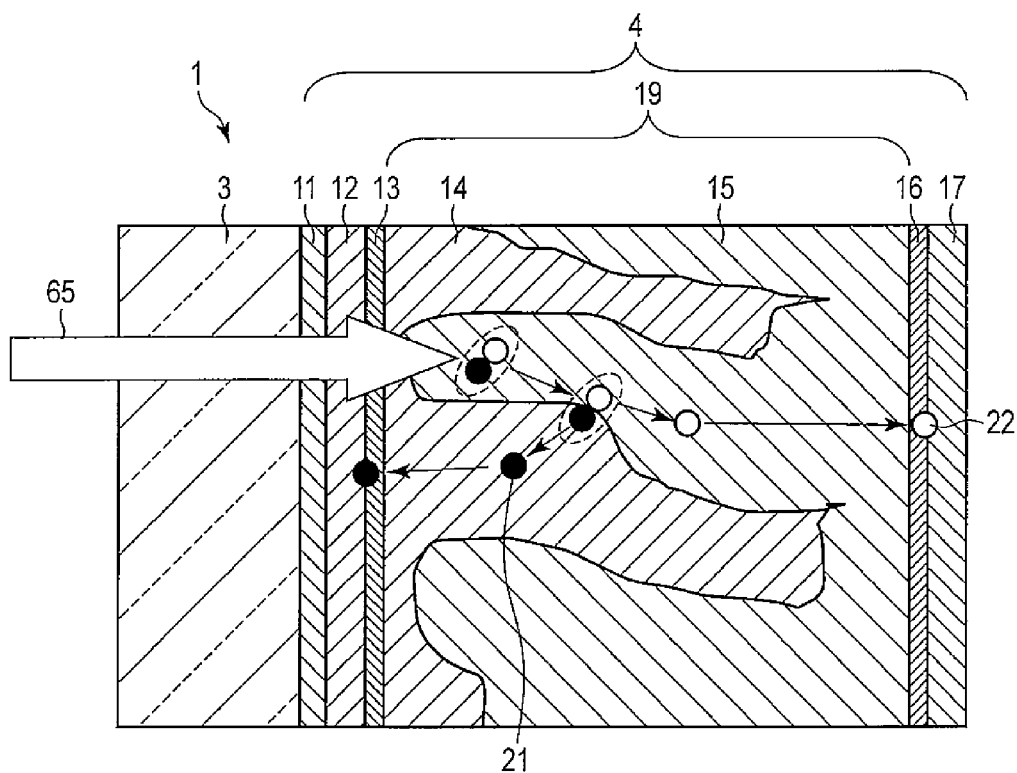
FIG. 5 is a further cross-section view conceptually showing a solar cell panel according to an embodiment.

FIG. 5 is the cross-section view of an example of the solar cell panel 1. As shown, the solar cell panel 1 comprises, laminated together sequentially from the side facing the reflective surface 2, a substrate 3, an ITO electrode 11 as a second electrode, an auxiliary electrode 12, a hole transport layer 13, a photoelectric conversion layer 19, an electron transport layer 16 and a negative electrode 17. The photoelectric conversion layer 19 comprises a p-type semiconductor 14 and an n-type semiconductor 15.

The solar cell panel 1 according to an embodiment is of a bulk heterojunction type. The bulk heterojunction photoelectric conversion layer 19 is characterized in that a p-type organic semiconductor 14 and an n-type organic semiconductor 15 are blended together so that a nano-order pn junction spreads throughout the photoelectric conversion layer 19. Accordingly, the pn junction region is larger than that of the conventional laminated organic thin-film solar cell, and the region contributing to actual power generation spreads throughout the photoelectric conversion layer 19. Therefore, the region contributing to power generation of the bulk heterojunction organic thin-film solar cell is overwhelmingly thicker than that of the conventional laminated organic thin-film solar cell, so that the efficiency of photon absorption is enhanced and the amount of electric current output is increased.

The photoelectric conversion process of the organic thin-film solar cell is largely divided into the step of light absorption by an organic molecule to thereby generate an exciton (a), the step of exciton transfer and diffusion (b), the step of charge separation of the exciton (c) and the step of charge transport to both poles (d).

In the step (a), a p-type organic semiconductor or an n-type organic semiconductor absorbs light to thereby generate an exciton. Subsequently, in the step (b), the generated exciton is transferred by diffusion to a p/n junction interface. In the step (c), the exciton having reached the p/n junction interface is separated into an electron 22 and a hole 21. Finally, in the step (d), individual optical carriers are transported through the p/n material to the electrodes and taken out into an external circuit.

It is preferred for the light transmission of the photoelectric conversion layer 19 to be in the range of 10 to 85%. When the light transmission does not fall within this range, the effect of enhancing the photoelectric conversion efficiency by increasing the tilt angle θ is slight.

The solar cell panel 1 can be optionally provided with a bus bar 18 and an auxiliary electrode 12. These are provided in order to compensate for the low electric conductivity of the second electrode. These are electrically connected to the second electrode and are made of a material having an electric conductivity higher than that of the second electrode. The bus bar 18 is disposed in, for example, the region of the solar cell panel 1 in which light does not fall. On the other hand, the auxiliary electrode 12 is disposed in, for example, the region of the solar cell panel 1 in which light falls.

When, for example, an ITO electrode 11 is used as the second electrode, while the ITO electrode 11 due to its transparency permits the transmission of incident light 65 to the photoelectric conversion layer 19, its electric conductivity is low as compared with those of common metal electrodes. Consequently, the electric current generated by the photoelectric conversion layer 19 is consumed in a given ratio by the resistance within the ITO electrode 11. The inhibition of electric current consumption and the enhancement of power generating efficiency can be accomplished by electrically connecting the bus bar 18 and the auxiliary electrode 12 to the ITO electrode 11 so as to introduce a bypass of electric current. The bus bar 18 and the auxiliary electrode 12 are made of a material having an electric conductivity higher than that of the second electrode. The material is, for example, a metal, such as copper or silver alloy. However, as such a material does not transmit light, the bus bar 18 and the auxiliary electrode 12 are disposed in a way such that the obstruction of the passage of incident light 65 can be minimized.

In the organic thin-film solar cell module 100 according to an embodiment, the bus bar 18 can be disposed on the surface facing the photoelectric conversion layer 19 among the surfaces of the substrate 3 and second electrode. It is preferred for the electric resistance of the bus bar 18 to be low. For example, the bus bar 18 is formed at 0.1Ω or below (preferably 0.01Ω or below) in terms of sheet resistance.

On the other hand, the auxiliary electrode 12 is interposed between the second electrode 11 and the photoelectric conversion layer 19. Referring to FIG. 5, when the hole transport layer 13 is provided, the auxiliary electrode 12 is interposed between the second electrode 11 and the hole transport layer 13. FIGS. 6A to 6D show examples of the auxiliary electrodes 12. FIGS. 6A to 6D each show the forms of the bus bar 18 and auxiliary electrode 12 as viewed from the side of the light receiving surface with respect to the solar cell panel 1 provided with both the bus bar 18 and the auxiliary electrode 12. The auxiliary electrode 12 does not cover the entirety of the plane and is provided so that light can pass through gaps thereof. The auxiliary electrode 12 can be provided in the form of lines as shown in FIGS. 6A and 6B or in the form of a mesh as shown in FIGS. 6C and 6D. The auxiliary electrode 12 can be electrically connected to the bus bar 18. In FIG. 6A, an auxiliary electrode 12a is provided in the form of a plurality of lines parallel to the direction of short side. By virtue of this auxiliary electrode 12a, the power consumption by resistance in the ITO electrode 11 can be inhibited while minimizing the blocking of light. Alternatively, referring to FIGS. 6B to 6D, it is preferred that, in the cross section along the direction of short side, a region in which the auxiliary electrode 12 exists and a region in which the auxiliary electrode 12 does not exist alternately exist in the direction of width. FIG. 6B shows an auxiliary electrode 12b composed of a plurality of lines parallel to each other, inclined to the direction of short side. FIG. 6C shows an auxiliary electrode 12c composed of a plurality of lines parallel to each other, inclined in the direction of short side, which lines are bridged together at intervals. The auxiliary electrode 12c can be expressed as being in the form of a mesh, bricks and a ladder. FIG. 6D shows an auxiliary electrode 12d composed of a plurality of corrugated lines inclined to the direction of short side, which lines are bridged together at intervals. The auxiliary electrode 12d can also be expressed as being in the form of a mesh. Incident light striking the photoelectric conversion layer might be reflected by the auxiliary electrode 12. However, the light having been reflected by the auxiliary electrode 12 is reflected by the reflective surface 2 and falls once more in the photoelectric conversion layer. When a region in which the auxiliary electrode 12 exists and a region in which the auxiliary electrode 12 does not exist in the cross section along the direction of short side alternately exist in the direction of width as shown in FIGS. 6B to 6D, even if light is once reflected on the surface of the auxiliary electrode 12, the light is repeatedly reflected between the reflective surface 2 and the photoelectric conversion layer. Therefore, finally, most of the light is absorbed through portions where the auxiliary electrode 12 does not exist into the photoelectric conversion layer 19.

FIG. 6E shows a form in which the substrate is provided with the bus bar only and is not provided with the auxiliary electrode.

Below, the reflective surface 2 will be described.

It is preferred for the reflective surface 2 to exhibit a high light reflectance. For example, the light reflectance of the reflective surface 2 is preferably in the range of 90 to 100%.

The closer to 100% the light reflectance, the higher the power generating efficiency of the organic thin-film solar cell module 100. The reflective surface 2 can be prepared from a material with which such a light reflectance can be attained. For example, any of a sheet of a metal, such as aluminum or chromium, having its surface highly polished, a specular reflector sheet as obtained by providing the surface of glass, a resin or the like with a reflection coating by silver plating, etc., a reflector sheet as obtained by providing the surface of glass, a resin or the like with aluminum by vapor deposition, a film of any of various metals and the like can be used as the reflective surface 2. In particular, a reflector sheet exhibiting a reflectance of 97% or higher can be fabricated from, for example, Vikuiti ESR as a reflection film produced by 3M Company, Luiremirror produced by Reiko Co., Ltd. or the like. The reflective surface 2 can be a diffuse reflective surface. The diffuse reflective surface is capable of dispersed reflection of light toward the solar cell panel 1. The above-mentioned phenomenon of repeated reflection of incident light between the auxiliary electrode 12 and the reflective surface 2 can be alleviated by using the diffuse reflective surface. As the diffuse reflective surface, use can be made of, for example, one obtained by providing the surface of any of the above-mentioned materials with minute asperity.

Below, the sub-module will be described.

The organic thin-film solar cell module 100 according to an embodiment may be composed of a plurality of sub-modules 10. The size of the organic thin-film solar cell module 100 composed of a plurality of sub-modules 10 can be arbitrarily changed by regulating the number of sub-modules 10. Accordingly, it is not needed to manufacture the organic thin-film solar cell module 100 conforming to the size of installation location. FIG. 1 shows an example of the organic thin-film solar cell module 100 composed of a plurality of sub-modules 10. In the organic thin-film solar cell module 100 of FIG. 1, a plurality of sub-modules 10 is arranged in the first direction 61. In another arrangement, the organic thin-film solar cell module 100 can be built with sub-modules 10 arranged in diverse directions. Each of the sub-modules 10 can be provided with one solar cell panel 1 and one reflective surface 2. In each the sub-modules, the solar cell panel 1 and the reflective surface 2 may oppositely face each other, or the solar cell panel 1 and the reflective surface 2 may back to back obliquely face each other as seen in the sub-module 10 of FIG. 12A to 12C. When the back to back arrangement is made, upon the assembly of sub-modules 10, the solar cell panel 1 provided in one sub-module 10 obliquely faces the reflective surface 2 provided in another adjacent sub-module 10.

The constituent members of the organic thin-film solar cells according to the embodiments will be described below.

(Substrate)

The substrate supports other constituent members, such as the electrodes and the photoelectric conversion layer. It is preferred for the substrate to be one capable of forming an electrode and not affected by heat or organic solvents. As the material of the substrate, there can be mentioned, for example, an inorganic material, such as non-alkali glass or quartz glass; a polymer film or plastic, such as polyethylene, polyethylene terephthalate (PET), polyethylene naphthalate (PEN), a polyimide, a polyamide, a polyamidoimide, a liquid crystal polymer or a cycloolefin polymer; a metal, such as stainless steel (SUS) or silicon; or the like. The thickness of the substrate is not particularly limited as long as it ensures a strength satisfactory for supporting other constituent members.

The light incidence surface of the substrate can be provided with, for example, an antireflection film of moth-eye structure. This makes it feasible to realize the efficient incoming of light and hence to enhance the energy conversion efficiency of cells. The moth-eye structure refers to a structure in which an orderly array of 100 nm or so projections is provided on a surface. This projection structure continuously changes the refractive index along the direction of thickness, so that by means of an intermediary non-reflection film, a face of discontinuous change of refractive index can be eliminated to thereby reduce the light reflection and enhance the cell efficiency.

(Second Electrode)

The second electrode is formed on the substrate 3. The material of the second electrode is not particularly limited as long as it is electrically conductive. Generally, a transparent or translucent conductive material is formed into a film by using a vacuum vapor deposition technique, a sputtering technique, an ion plating technique, a plating technique, a coating technique or the like. As the transparent or translucent electrode material, there can be mentioned a conductive metal oxide film, a translucent metal thin-film or the like. In particular, use is made of a film (NESA, etc.) of conductive glass containing indium oxide, zinc oxide, tin oxide, indium.tin.oxide (ITO) being a complex thereof, fluorine-doped tin oxide (FTO), indium.zinc.oxide or the like, gold, platinum, silver, copper, etc. ITO and FTO are especially preferred. Also, as the electrode material, use may be made of an organic conductive polymer, such as polyaniline or its derivative, polythiophene or its derivative, etc. The thickness of the second electrode when the material is ITO is preferably in the range of 30 to 300 nm. When the thickness is less than 30 nm, the conductivity is decreased, and the resistance becomes high, thereby causing lowering of the photoelectric conversion efficiency. When the thickness exceeds 300 nm, the ITO loses its flexibility, so that when a stress is applied, the ITO cracks. It is preferred for the sheet resistance of the second electrode 11 to be as low as possible, for example, $10\Omega/\square$ or less. The second electrode 11 may be a monolayer or a multilayer containing materials exhibiting different work functions.

(Hole Transport Layer)

The hole transport layer is optionally interposed between the second electrode and the photoelectric conversion layer. The functions of the hole transport layer are, for example, to level any unevenness of the underneath electrode to thereby prevent short-circuiting of the solar cell device, to efficiently transport holes only and to prevent the annihilation of excitons generated in the vicinity of the interface with the photoelectric conversion layer. As the material of the hole transport layer, use can be made of a polythiophene polymer such as PEDOT/PSS (poly(3,4-ethylenedioxythiophene)-poly(styrene sulfonate)), or an organic semiconductor polymer such as polyaniline or polypyrrole. As representative polythiophene polymer products, there can be mentioned, for example, Clevios PH500 (trade name), Clevios PH (trade name), Clevios PVPA1 4083 (trade name) and Clevios HIL1.1 (trade name) all available from Stark GmbH.

When Clevios PH500 (trade name) is used as the material of the hole transport layer, it is preferred for the thickness thereof to be in the range of 20 to 100 nm. When the layer is extremely thin, it is no longer capable of preventing the short-circuiting of the underneath electrode, so that short-circuiting occurs. On the other hand, when the layer is extremely thick, the film resistance becomes high to thereby restrict generated currents. Thus, the photoelectric conversion efficiency is lowered.

The method of forming the hole transport layer is not particularly limited as long as the method is suitable for the formation of a thin film. For example, the layer can be applied by a spin coating technique or the like. The material of the hole transport layer is applied in a desired thickness and dried by heating by means of a hot plate or the like. The heat drying is preferably carried out at 140 to 200° C. for several minutes to about 10 minutes. Preferably, the applied solution is filtered before use.

(Photoelectric Conversion Layer)

The photoelectric conversion layer is disposed between the first electrode and the second electrode. The solar cell of the embodiment is one of bulk heterojunction type. The bulk heterojunction solar cell is characterized in that a p-type semiconductor and an n-type semiconductor are mixed together in the photoelectric conversion layer to thereby have a micro layer-separated structure. In the bulk heterojunction solar cell, a p-type semiconductor and an n-type semiconductor mixed together produces a nano-order sized pn junction in the photoelectric conversion layer, and electric current is obtained by utilizing a photocharge separation occurring on a junction interface. The p-type semiconductor is composed of a material with electron-donating properties. On the other hand, the n-type semiconductor is composed of a material with electron-accepting properties. In the embodiments, at least either the p-type semiconductor or the n-type semiconductor may be an organic semiconductor.

As the p-type organic semiconductor, use can be made of, for example, polythiophene or its derivative, polypyrrole or its derivative, a pyrazoline derivative, an arylamine derivative, a stilbene derivative, a triphenyldiamine derivative, oligothiophene or its derivative, polyvinylcarbazole or its derivative, polysilane or its derivative, a polysiloxane derivative containing an aromatic amine on its side chain or principal chain, polyaniline or its derivative, a phthalocyanine derivative, porphyrin or its derivative, polyphenylenevinylene or its derivative, polythienylenevinylene or its derivative, etc. These may be used in combination. Also, use can be made of copolymers thereof. For example, there can be mentioned a thiophene-fluorene copolymer, a phenyleneethynylene-phenylenevinylene copolymer, or the like.

Preferred p-type organic semiconductors are polythiophene being a conductive polymer with π-conjugation and its derivatives. Polythiophene and its derivatives can ensure high stereoregularity and exhibit relatively high solubility in solvents. Polythiophene and its derivatives are not particularly limited as long as they are compounds having a thiophene skeleton. As specific examples of the polythiophene and derivatives thereof, there can be mentioned a polyalkylthiophene, such as poly-3-methylthiophene, poly-3-butylthiophene, poly-3-hexylthiophene, poly-3-octylthiophene, poly-3-decylthiophene or poly-3-dodecylthiophene; a polyarylthiophene, such as poly-3-phenylthiophene or poly-3-(p-alkylphenylthiophene); a polyalkylisothionaphthene, such as poly-3-butylisothionaphthene, poly-3-hexylisothionaphthene, poly-3-octylisothionaphthene or poly-3-decylisothionaphthene; polyethylenedioxythiophene; and the like.

In recent years, derivatives such as PCDTBT (poly[N-9"-hepatadecanyl-2,7-carbazole-alt-5,5,-(4',7'-di-2-thienyl-2', 1',3'-benzothiazole)]) being a copolymer of carbazole, benzothiazole and thiophene are known as compounds realizing an excellent photoelectric conversion efficiency.

Any of these conductive polymers can be formed into a film by dissolving the same in a solvent and applying the solution by a coating technique. Therefore, these conductive polymers are advantageous in that an organic thin-film solar cell of large area can be manufactured at low cost by a printing technique or the like using inexpensive equipment.

Fullerene and its derivatives are appropriately used as the n-type organic semiconductor. The employed fullerene derivatives are not particularly limited as long as the derivatives contain fullerene skeletons. For example, there can be mentioned derivatives including C60, C70, C76, C78, C84, etc. as fundamental skeletons. In the fullerene derivatives, the carbon atoms of each fullerene skeleton may be modified by arbitrary functional groups, and such functional groups may be bonded to each other to thereby form a ring. The fullerene derivatives include fullerene-bonded polymers. Fullerene derivatives having a functional group of high affinity to solvents, thereby exhibiting a high solubility in solvents, are preferred.

As the functional groups that can be introduced in the fullerene derivatives, there can be mentioned, for example, a hydrogen atom; a hydroxyl group; a halogen atom, such as a fluorine atom or a chlorine atom; an alkyl group, such as a methyl group or an ethyl group; an alkenyl group, such as a vinyl group; a cyano group; an alkoxy group, such as a methoxy group or an ethoxy group; an aromatic hydrocarbon group, such as a phenyl group or a naphthyl group; an aromatic heterocyclic group, such as a thienyl group or a pyridyl group; and the like. For example, there can be mentioned a hydrogenated fullerene, such as $C_{60}H_{36}$ or $C_{70}H_{36}$; an oxide fullerene, such as $C_{60}$ or $C_{70}$; a fullerene metal complex; and the like.

It is most preferred to use 60PCBM ([6,6]-phenylC61 butyric methyl ester) and 70PCBM ([6,6]-phenylC71 butyric methyl ester) as fullerene derivatives among the above-mentioned compounds.

When an unmodified fullerene is used, using C70 is preferred. The fullerene C70 exhibits a high optical carrier generating efficiency, thereby being suitable for use in an organic thin-film solar cell.

With respect to the mixing ratio of n-type organic semiconductor and p-type organic semiconductor in the photoelectric conversion layer, when the p-type semiconductor is any of P3AT series, approximately n:p=1:1 is preferred. When the p-type semiconductor is any of PCDTBT series, approximately n:p=4:1 is preferred.

In the application of an organic semiconductor by coating, the semiconductor must be dissolved in a solvent. As suitable solvents, there can be mentioned, for example, an unsaturated hydrocarbon solvent, such as toluene, xylene, tetralin, decalin, mesitylene, n-butylbenzene, sec-butylbenzene or tert-butylbenzene; a halogenated aromatic hydrocarbon solvent, such as chlorobenzene, dichlorobenzene or trichlorobenzene; a halogenated saturated hydrocarbon solvent, such as carbon tetrachloride, chloroform, dichloromethane, dichloroethane, chlorobutane, bromobutane, chloropentane, chlorohexane, bromohexane or chlorocyclohexane; and an ether, such as tetrahydrofuran or tetrahydropyran. Of these, halogenated aromatic solvents are preferred. These solvents may be used alone or in combination.

As the technique for forming the solution into a film by coating, there can be mentioned a spin coat technique, a dip coat technique, a casting technique, a bar coat technique, a roll coat technique, a wire bar coat technique, a spray technique, a screen printing technique, a gravure printing technique, a flexographic printing technique, an offset printing technique, a gravure offset printing technique, a dispenser coat technique, a nozzle coat technique, a capillary coat technique, an inkjet technique or the like. These coating techniques can be used alone or in combination.

(Electron Transport Layer)

The electron transport layer is optionally disposed between the first electrode and the photoelectric conversion layer. The functions of the electron transport layer are to efficiently transport electrons only while blocking holes and to prevent the annihilation of excitons generated at the interface of the photoelectric conversion layer and the electron transport layer.

As the material of the electron transport layer 15, there can be mentioned a metal oxide, for example, amorphous titanium oxide obtained by hydrolyzing a titanium alkoxide by a sol gel method, or the like. The film forming method is not particularly limited as long as the method is suitable for the formation of a thin film. For example, there can be mentioned a spin coat technique. When titanium oxide is used as the material of the electron transport layer, the thickness of the thus formed layer is preferably in the range of 5 to 20 nm. When the thickness is smaller than the above range, a hole block effect lessens, so that generated excitons deactivate before dissociation into an electron and a hole. Thus, efficiently taking out current is infeasible. On the other hand, when the thickness is extremely large, the film resistance becomes large to thereby restrict generated currents. Thus, the photoelectric conversion efficiency is lowered. The coating solution is preferably filtered before use. After coating in a given thickness, the layer is dried by heating by means of, for example, a hot plate. Heat drying is preferably carried out at 50 to 100° C. for several minutes to about 10 minutes in air while promoting hydrolysis.

(First Electrode)

The first electrode is superimposed on the photoelectric conversion layer (or electron transport layer). A conductive material is formed into a film by a vacuum vapor deposition technique, a sputtering technique, an ion plating technique, a plating technique, a coating technique or the like. As the electrode material, there can be mentioned a conductive metal thin-film, a metal oxide film or the like. When the second electrode is formed of a material of high work function, it is preferred to use a material of low work function in the first electrode. Examples of materials of low work function include an alkali metal, an alkaline earth metal and the like. Specifically, there can be mentioned Li, In, Al, Ca, Mg, Sm, Tb, Yb, Zr, Na, K, Rb, Cs, Ba and alloys of these.

The first electrode may be a monolayer or a multilayer containing materials of different work functions. The material may be an alloy including at least one of the above materials of low work function and a member selected from among gold, silver, platinum, copper, manganese, titanium, cobalt, nickel, tungsten, tin and the like. Examples of the alloys include a lithium-aluminum alloy, a lithium-magnesium alloy, a lithium-indium alloy, a magnesium-silver alloy, a magnesium-indium alloy, a magnesium-aluminum alloy, an indium-silver alloy, a calcium-aluminum alloy and the like.

The film thickness of the first electrode is in the range of 1 to 500 nm, preferably 10 to 300 nm. When the film thickness is smaller than the above range, the resistance becomes so large that generated charges cannot satisfactorily be transferred to an external circuit. When the film thickness is very large, the formation of the film of the first electrode takes a prolonged period of time, so that the temperature of the material is increased to thereby damage the organic layers and cause performance deterioration. Further, the amount of material used is large, so that the period of occupying the film forming apparatus is prolonged to thereby cause a cost increase.

Example

Figure 7:
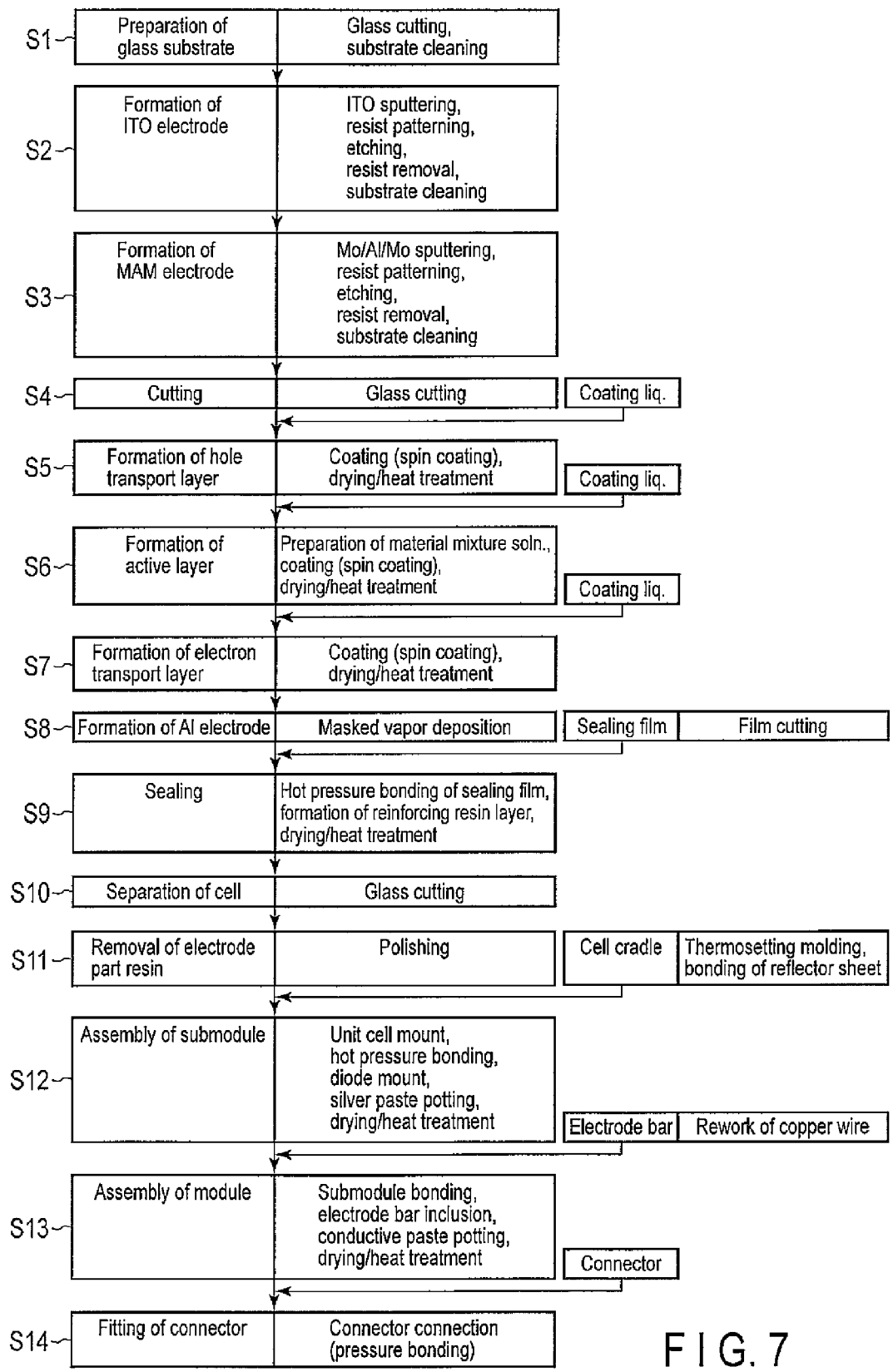
FIG. 7 is a flow chart showing an example of process for manufacturing an organic thin-film solar cell module according to an embodiment.

FIG. 7 shows in the form of a flow chart an example of process for manufacturing an organic thin-film solar cell module according to an embodiment. The organic thin-film solar cell module according to an embodiment was manufactured in accordance with this flow chart.

As a brief overview, the films of electrodes, a photoelectric conversion layer, etc. were sequentially formed on a glass substrate, thereby obtaining a solar cell panel. Sub-modules were fabricated using the thus obtained solar cell panel and a reflective surface. Finally, the sub-modules were assembled into an organic thin-film solar cell module.

The details will be described with reference to the flow chart of FIG. 7.

(S1: Preparation of Glass Substrate)

A non-alkali glass substrate was cut into an appropriate size. Specifically, the size was such that three solar cell panels were included. After cutting, the substrate was cleaned.

(S2: Formation of ITO Electrode)

Figure 8:
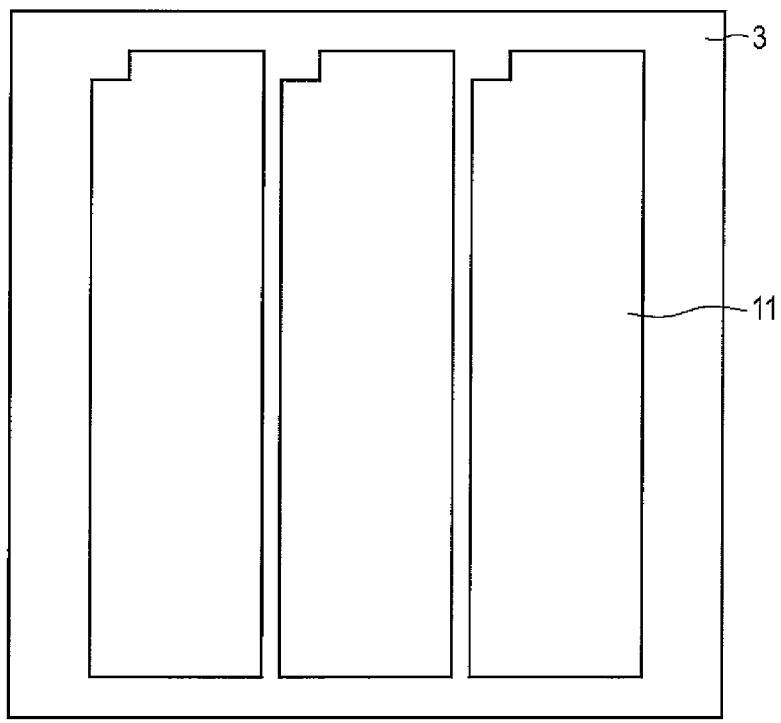
FIG. 8 is a view showing the configuration of an intermediate of organic thin-film solar cell module produced in the midstream of its manufacturing process according to an embodiment.

An ITO film was formed by sputtering on one major surface of the glass substrate. Patterning of the film was performed by a photoetching process (PEP). Namely, a resist film was formed on the ITO film and patterned, and using the same as a mask, etching was performed. Thereafter, the resist was removed, and the substrate was cleaned. The thus obtained ITO electrodes 11 are shown in FIG. 8.

(S3: Formation of MAM Electrode)

Figure 9:
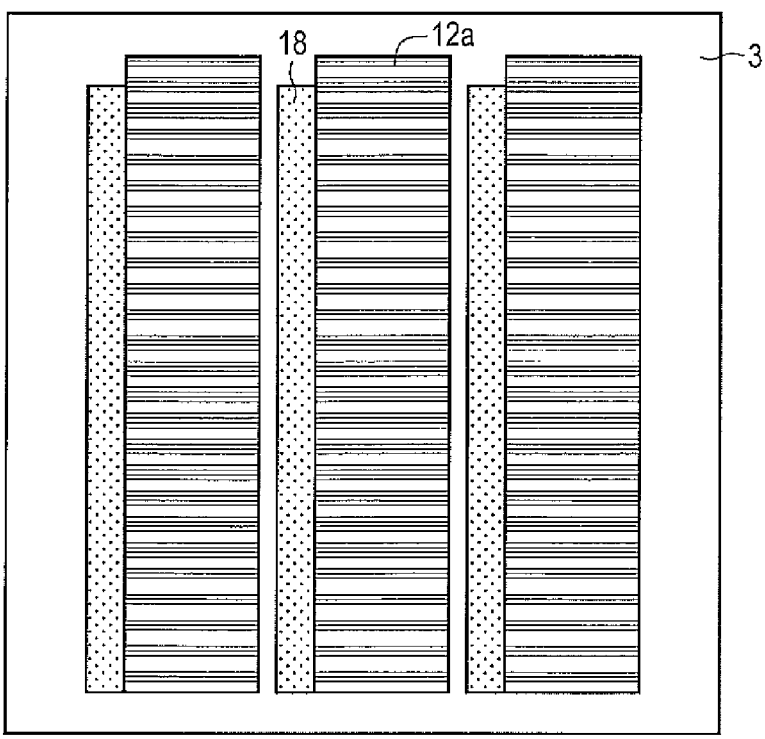
FIG. 9 is a view showing the configuration of another intermediate of organic thin-film solar cell module produced in the midstream of its manufacturing process according to an embodiment.

A bus bar and an auxiliary electrode were formed on each of the ITO electrodes. Namely, a Mo/Al/Mo film was superimposed by sputtering on the ITO electrodes after patterning. Further, the Mo/Al/Mo film was patterned by PEP. After patterning, the substrate was cleaned. The thus formed bus bars 18 and auxiliary electrodes 12a are shown in FIG. 9. Each of the bus bars 18 is provided in the form of a flat plate along one of the long sides of each of the ITO electrodes. Each of the auxiliary electrodes 12a is provided in the form of a plurality of lines parallel to the direction of short side, and is electrically connected to the bus bar 18.

(S4: Cutting)

After the formation of second electrodes, the glass substrate was cut into a size appropriate for subsequent processing.

(S5: Formation of Hole Transport Layer)

A material of hole transport layer was applied to each of the second electrodes by spin coating, and fixed by drying and heat treatment. Thus, hole transport layers were formed.

(S6: Formation of Active Layer)

A solution of material mixture prepared in advance was applied by spin coating on the hole transport layers, and fixed by drying and heat treatment. Thus, photoelectric conversion layers were formed.

(S7: Formation of Electron Transport Layer)

A material of electron transport layer was applied by spin coating on the photoelectric conversion layers, and fixed by drying and heat treatment. Thus, electron transport layers were formed.

(S8: Formation of Al Electrode)

Masked vapor deposition of aluminum in vacuum was performed on the electron transport layers, thereby forming first electrodes. The thickness of the film formed by Al vapor deposition was about 700 nm. The thus formed first electrodes 17 are shown in FIG. 10.

(S9: Sealing)

Hot pressure bonding of an appropriately cut functional PET film onto the first electrodes was performed for sealing purposes. The functional PET film comprises a moisture-barrier layer, such as a silica film, and a hot bonding layer (EVA).

(S10: Separation of Cell)

The glass substrate was cut along a cutting line, so that individual solar cell panels were separated from each other. FIG. 11 shows an example of cutting line 66. Three solar cell panels are obtained by the separation along the cutting line 66.

(S11: Removal of Electrode Part Resin)

The second electrodes were surfaced by polishing and covered with a conductive paste.

(S12: Assembly of Sub-Module)

A thermosetting epoxy resin filled with minute particles of silica at a high ratio (85% or higher), excelling in moisture-proof properties, was molded into a sub-module base, and a light reflection sheet was bonded to the sub-module base. Further, the above obtained solar cell panel together with a diode was mounted on the sub-module base, and fixed with an adhesive while ensuring the electric conductivity with a silver paste.

The thus obtained sub-module 10 is shown in FIGS. 12A to 12C. FIG. 12A shows the sub-module 10 viewed from the side provided with the solar cell panels 1. This sub-module 10 is provided with three solar cell panels 1. The sub-module 10 has a throughhole 51 for fixing, through which a bolt or the like is passed to thereby fix a plurality of sub-modules 10. Further, the sub-module 10 has a throughhole 52 for electrodes, through which a copper wire or the like is passed to thereby electrically connect a plurality of sub-modules 10 to each other. The throughhole 52 for electrodes is electrically connected to the electrode of solar cell panel 1 by means of a silver paste 53. FIG. 12B shows the sub-module 10 viewed from the side provided with the reflective surfaces 2. It is seen that the reflective surfaces 2 are provided back to back correspondingly to the positions of the solar cell panels 1. FIG. 12C shows the configuration of the side face of the sub-module 10 viewed from the side of short side. It is seen that the solar cell panel 1 and the reflective surface 2 are arranged so as to back to back obliquely face each other. The positions in which the throughholes 51 for fixing and throughholes 52 for electrodes are provided are shown by dashed lines.

(S13: Assembly of Module)

An obtained plurality of sub-modules 10 were assembled together, bolts were passed through the throughholes 51 for fixing, and copper wires were passed through the throughholes 52 for electrodes. Thus, an organic thin-film solar cell module was obtained. FIG. 13 is a side view of the organic thin-film solar cell module 100 having been assembled in the above manner. Bolts as a fixing tool 54 were passed through the throughholes 51 for fixing, and copper wires were passed through the throughholes 52 for electrodes, so that a plurality of sub-modules 10 are fixed into one unit and electrically connected to each other.

(S14: Fitting of Connector)

Finally, connectors were fitted to the copper wires, thereby completing the organic thin-film solar cell module 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic thin-film solar cell module comprising:
    a plurality of solar cell panels, each panel comprising a substrate with first and second main surfaces, a first electrode facing the first main surface, a second electrode interposed between the substrate and the first electrode, and a photoelectric conversion layer interposed between the first and second electrodes;
    a plurality of reflective surfaces, each obliquely facing a portion of the second main surface of each solar cell panel; and
    bus bars each disposed on the substrate of the solar cell panel, each of the bus bars being electrically connected to the second electrode and made of a material whose electric conductivity is higher than that of the second electrode,
    wherein a first plane including the reflective surface and intersecting with the second main surface of the substrate, an intersection line at which the first plane intersects with the second main surface of the substrate, and a second plane including the intersection line and forming an angle of 45° with the second main surface of the substrate and forming an angle smaller than 45° with the first plane are defined so that the second main surface of the substrate of the solar cell panel receives incident light from the reflective surface mainly in an oblique direction,
    an edge of the reflective surface directing toward the second main surface of the substrate is not in contact with the second main surface to provide a gap between them,
    the second plane intersects with the solar cell panel to divide the solar cell panel into a first region on which incident light falls and a second region on which incident light does not fall, the first region and the second region bordering on each other in the solar cell panel,
    the photoelectric conversion layer is provided in the first region and an edge of the photoelectric conversion layer adjacent to the second region is in contact with the second plane, and
    the bus bar is disposed on the second region.

2. The organic thin-film solar cell module according to claim 1, further comprising an auxiliary electrode disposed between the second electrode and the photoelectric conversion layer in the first region and made of a material whose electric conductivity is higher than that of the second electrode,
    wherein a region in which the auxiliary electrode is present and a region in which the auxiliary electrode is absent alternately appear in lines on each solar cell panel that are arranged perpendicular to the intersection line.

3. The organic thin-film solar cell module according to claim 1, wherein the reflective surfaces are diffuse reflection surfaces.

4. The organic thin-film solar cell module according to claim 1, wherein the photoelectric conversion layer is of a bulk heterojunction type containing a p-type organic semiconductor and an n-type organic semiconductor.

5. The organic thin-film solar cell module according to claim 1, wherein the module includes a plurality of sub-modules, each of the sub-modules comprising one of the plurality of solar cell panels and one of the plurality of reflective surfaces.

6. The organic thin-film solar cell module according to claim 5, wherein, in each sub-module, the reflective surface and the solar cell panel are arranged so as to back to back obliquely face each other.

7. An organic thin-film solar cell sub-module comprising:
a solar cell panel comprising a substrate with first and second main surfaces, a first electrode facing the first main surface, a second electrode interposed between the substrate and the first electrode, and a photoelectric conversion layer interposed between the first and second electrodes; and
a reflective surface arranged such that the solar cell panel and the reflective surface back to back obliquely face each other,
wherein the sub-module has a structure that allows two or more sub-modules to be assembled into an organic thin-film solar cell module in which the reflective surface of each sub-module obliquely faces a portion of the substrate of the solar cell panel of the adjacent sub-module,
wherein, in each combination of the solar cell panel and the reflective surface obliquely facing each other,
a first plane including the reflective surface and intersecting with the second main surface of the substrate, an intersection line at which the first plane intersects with the second main surface of the substrate, and a second plane including the intersection line and forming an angle of 45° with the second main surface of the substrate and forming an angle smaller than 45° with the first plane are defined so that the second main surface of the substrate of the solar cell panel receives incident light from the reflective surface mainly in an oblique direction,
an edge of the reflective surface directing toward the second main surface of the substrate is not in contact with the second main surface to provide a gap between them,
the second plane intersects with the solar cell panel to divide the solar cell panel into a first region on which incident light falls and a second region on which incident light does not fall, the first region and the second region bordering on each other in the solar cell panel,
the photoelectric conversion layer is provided in the first region and an edge of the photoelectric conversion layer adjacent to the second region is in contact with the second plane, and
the second region allowing to be provided with a bus bar such that the bus bar is electrically connected to the second electrode, the bus bar being made of a material whose electric conductivity is higher than that of the second electrode.

8. A solar cell module comprising:
solar cell panels each including a substrate with first and second main surfaces, a first electrode facing the first main surface, a second electrode interposed between the substrate and the first electrode, and a photoelectric conversion layer interposed between the first and second electrodes, the solar cell panels being arranged in a first direction with a gap therebetween such that the second main surface of the substrate of each solar panel tilts to the first direction; and
reflective surfaces alternating with the solar cell panels in the first direction, and each of the reflective surfaces obliquely facing a portion the second main surface,
wherein, in a combination including one of the solar cell panels and one of the reflective surfaces obliquely facing the second main surface of the substrate of the one solar cell panel,
a first plane including the reflective surface and intersecting with the second main surface of the substrate, an intersection line at which the first plane intersects with the second main surface of the substrate, and a second plane including the intersection line and forming an angle of 45° with the second main surface of the substrate and forming an angle smaller than 45° with the first plane are defined so that the second main surface of the substrate of the solar cell panel receives incident light from the reflective surface mainly in an oblique direction,
an edge of the reflective surface directing toward the second main surface of the substrate is not in contact with the second main surface to provide a gap between them,
the second plane intersects with and the solar cell panel to divide the solar cell panel into a first region on which incident light falls and a second region on which incident light does not fall, the first region and the second region bordering on each other in the solar cell panel,
the photoelectric conversion layer is provided in the first region and an edge of the photoelectric conversion layer adjacent to the second region is in contact with the second plane, and
the second region allows to be provided with a bus bar such that the bus bar is electrically connected to the second electrode, the bus bar being made of a material whose electric conductivity is higher than that of the second electrode.

9. The solar cell module according to claim 8, further comprising a support member including sub-members arranged in the first direction, each sub-member supporting the solar cell panel and the reflective surface such that the reflective surface supported by one of the sub-members obliquely faces the second main surface of the substrate of the solar cell panel supported by the adjacent sub-member.

10. A sub-module, as one of a plurality of which to be assembled into the solar cell module according to claim 9, comprising:
the sub-member;
the solar cell panel supported by the sub-member; and
the reflective surface supported by the sub-member.

* * * * *